(12) United States Patent
Cheng et al.

(10) Patent No.: US 10,861,882 B2
(45) Date of Patent: Dec. 8, 2020

(54) PIXEL STRUCTURE

(71) Applicant: Au Optronics Corporation, Hsinchu (TW)

(72) Inventors: Mao-Hsun Cheng, Tainan (TW);
Chia-Che Hung, Tainan (TW);
Yung-Chih Chen, Taichung (TW);
Cheng-Yeh Tsai, Taipei (TW);
Cheng-Han Huang, Hsinchu (TW);
Chen-Chi Lin, Hsinchu County (TW)

(73) Assignee: Au Optronics Corporation, Hsinchu (TW)

( * ) Notice: Subject to any disclaimer, the term of this patent is extended or adjusted under 35 U.S.C. 154(b) by 6 days.

(21) Appl. No.: 16/512,416

(22) Filed: Jul. 16, 2019

(65) Prior Publication Data

US 2020/0027904 A1      Jan. 23, 2020

(30) Foreign Application Priority Data

Jul. 18, 2018   (TW) .............................. 107124819 A

(51) Int. Cl.
*H01L 27/12*      (2006.01)
*H01L 25/16*      (2006.01)
*H01L 27/13*      (2006.01)

(52) U.S. Cl.
CPC ........ *H01L 27/1255* (2013.01); *H01L 25/167* (2013.01); *H01L 27/13* (2013.01)

(58) Field of Classification Search
CPC .. G09F 9/33; G09G 3/006; G09G 3/32; H01L 25/167; H01L 27/1255; H01L 27/13; H01L 27/14609; H01L 33/0095
See application file for complete search history.

(56) References Cited

U.S. PATENT DOCUMENTS

| | | | |
|---|---|---|---|
| 8,791,530 B2 | 7/2014 | Bibl et al. | |
| 9,671,913 B2 * | 6/2017 | Heikkinen | ............ G06F 3/0443 |
| 2008/0198102 A1 * | 8/2008 | Yamashita | ........... G09G 3/3233 345/76 |
| 2017/0023979 A1 * | 1/2017 | Yamazaki | ............. G06F 1/1652 |
| 2020/0027380 A1 * | 1/2020 | Lee | ........................ H01L 27/323 |

FOREIGN PATENT DOCUMENTS

CN         106876552       6/2017

* cited by examiner

*Primary Examiner* — Allan R Wilson
(74) *Attorney, Agent, or Firm* — JCIPRNET

(57) ABSTRACT

A pixel structure includes a first TFT, an adhesive layer, an LED, and a detection conductive layer. The first TFT is coupled to a conductive layer and is configured to transmit display data to the conductive layer. The adhesive layer covers the conductive layer. The LED is disposed on the adhesive layer. The detection conductive layer is disposed on the adhesive layer, and the detection conductive layer, the adhesive layer, and the conductive layer constitute a detection capacitor. Here, a thickness of the detection conductive layer is equal to or slightly greater than a height of the LED.

12 Claims, 9 Drawing Sheets

PIXEL STRUCTURE

CROSS-REFERENCE TO RELATED APPLICATION

This application claims the priority benefit of Taiwan application serial no. 107124819, filed on Jul. 18, 2018. The entirety of the above-mentioned patent application is hereby incorporated by reference herein and made a part of this specification.

BACKGROUND

Technical Field

The disclosure relates to a pixel structure; more particularly, the disclosure relates to a light emitting diode (LED) pixel structure having a micro LED device.

Description of Related Art

A micro LED display characterized by the advantages of high brightness, high contrast, wide viewing angle, long service life, and low power consumption has become the focus of future display technology development. The technology of directly transporting the micro LED to a driving back plate is called a mass transfer process which is characterized by following difficulties. First, the size of the micro LED is extremely small (about 5 μm to 10 μm), thus requiring more refined operation techniques. In addition, hundreds of thousands or millions of the micro LEDs are required to form a panel, and one single transportation requires the movement of tens of thousands or even hundreds of thousands of the micro LEDs. During the mass transfer process, the micro LEDs and a thin film transistor (TFT) matrix may be bonded through performing a stamping process.

With reference to FIG. 1, which depicts a conventional micro LED display panel, when the stamping process is performed on a display panel 100, the stamping force cannot be effectively and evenly distributed onto the display panel 100; therefore, the stamping force applied to the display panel 100 may be different in strength, so that the luminance of the micro LEDs is not uniform as well. In case that the entire panel does not receive the even force, for instance, a region 101 located at a relatively central position of the display panel 100 receives a relatively strong stamping force, so that the micro LEDs may generate relatively greater luminance when the micro LEDs subsequently emit light. By contrast, the stamping force applied to regions outside the region 101 is relatively weak, so that the micro LEDs may generate relatively lower luminance when the micro LEDs subsequently emit light, thus resulting in an issue of uneven overall luminance of the display panel 100.

SUMMARY

The disclosure provides a pixel structure which may detect a stamping force through a detection capacitor and thereby adjust a driving electric signal provided to a micro LED.

In an embodiment of the disclosure, a pixel structure includes a first TFT, a conductive layer, an adhesive layer, an LED, and a detection conductive layer. The first TFT has a first terminal coupled to the conductive layer and is configured to transmit display data to the conductive layer. The adhesive layer is disposed on the conductive layer. The LED is disposed on the adhesive layer. The detection conductive layer is disposed on the adhesive layer, and the detection conductive layer, the adhesive layer, and the conductive layer constitute the detection capacitor. Here, a thickness of the detection conductive layer is equal to or slightly greater than a height of the LED.

According to an embodiment, when a stamping process is performed on the pixel structure, an upper surface of the LED and an upper surface of the detection conductive layer together receive the same stamping force.

According to an embodiment, the pixel structure further includes a second TFT, a control terminal of the second TFT is coupled to the conductive layer, a first terminal of the second TFT receives a reference voltage, and a second terminal of the second TFT is coupled to the LED.

According to an embodiment, a control terminal of the first TFT in the pixel structure receives a scan signal. The detection conductive layer receives a detection signal. Here, in a first time period, the first TFT is switched on according to the scan signal and transmits the display data to the control terminal of the second TFT, and the detection conductive layer simultaneously receives the detection signal at a first voltage level. In a second time period after the first time period, the first TFT is switched off according to the scan signal, and the detection conductive layer simultaneously receives the detection signal at a second voltage level. Here, the first voltage level is different from the second voltage level.

According to an embodiment, the scan signal and the detection signal in the pixel structure are the same signal.

According to an embodiment, in the pixel structure, when the first TFT and the second TFT are both p-type TFTs, the first voltage level is lower than the second voltage level, and the reference voltage is a first power voltage.

According to an embodiment, in the pixel structure, when the first TFT and the second TFT are both n-type TFTs, the first voltage level is higher than the second voltage level, and the reference voltage is a second power voltage.

According to an embodiment, the detection conductive layer of the pixel structure is coupled to the first terminal of the second TFT.

According to an embodiment, a second terminal of the first TFT in the pixel structure receives an initial voltage or the display data. When the first TFT is switched on, the first TFT sequentially receives and transmits the initial voltage and the display data to the control terminal of the second TFT.

According to an embodiment, the pixel structure further includes a third TFT. One terminal of the third TFT receives the initial voltage, and the other terminal of the third TFT is coupled to the control terminal of the second TFT. The third TFT is controlled by a pre-scan signal and is thus switched on or off.

According to an embodiment, the pixel structure further includes a storage capacitor coupled between the control terminal and the first terminal of the second TFT.

According to an embodiment, in the pixel structure, the second TFT generates a driving current to drive the LED, and a capacitance of the driving current and a capacitance of the detection capacitor are negatively correlated.

In view of the above, the detection conductive layer whose height is not lower than that of the LED is configured to receive a pressure exerted during the stamping process, and the value of the capacitance of the detection capacitor constituted by the detection conductive layer, the adhesive layer, and the conductive layer is adjusted according to the pressure received by the detection conductive layer. Besides, the amount of the driving current driving the LED is adjusted according to the capacitance of the detection capacitor, so as to better bring the luminance of the LEDs in the panel into uniformity and improve display quality.

To make the above features and advantages provided in one or more of the embodiments more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles described herein.

DESCRIPTION OF THE EMBODIMENTS

Figure 2:
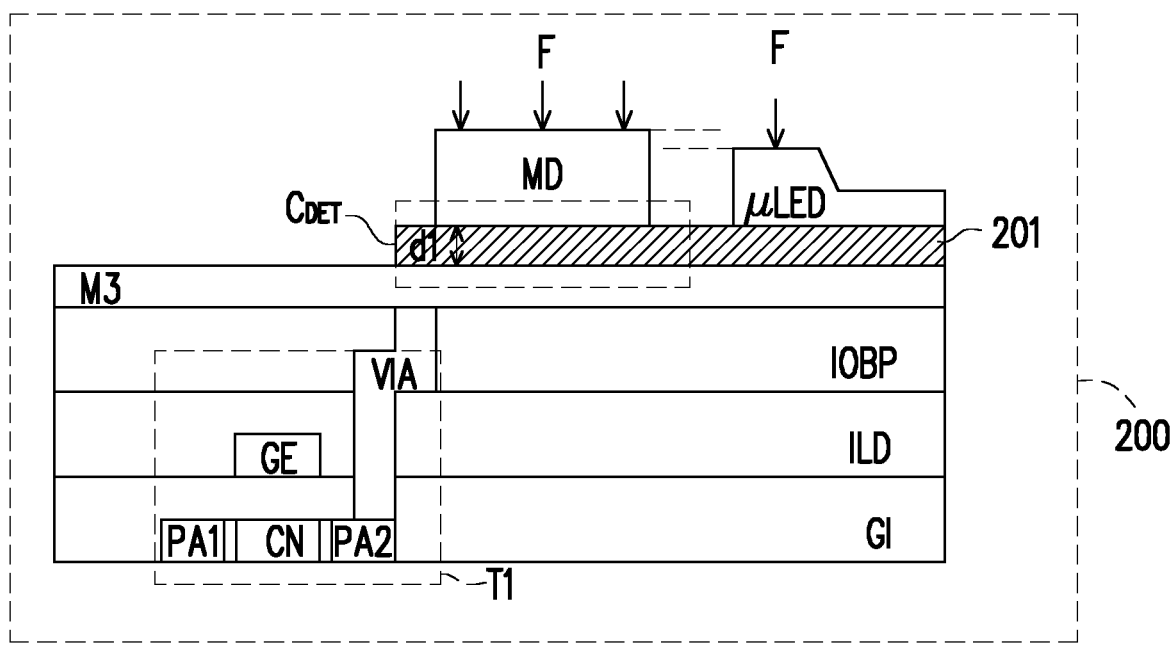
FIG. 2 is a schematic cross-sectional view of a pixel structure according to an embodiment of the invention.

With reference to FIG. 2, which is a schematic cross-sectional view of a pixel structure according to an embodiment of the disclosure, a pixel structure 200 includes a first insulating layer IOBP, a second insulating layer ILD, a third insulating layer GI, a first TFT T1, a conductive layer M3, an adhesive layer 201, a micro LED μLED, and a detection conductive layer MD. In the present embodiment, the first TFT T1 is disposed in multiple insulating layers (i.e., the first insulating layer IOBP, the second insulating layer ILD, and the third insulating layer GI), and the conductive layer M3 is disposed on and covers the first insulating layer IOBP. One terminal (source or drain) of the first TFT T1 is coupled to the conductive layer M3 through a conductive via VIA. Besides, the adhesive layer 201 is disposed above the conductive layer M3, and the detection conductive layer MD and the micro LED μLED are disposed above the adhesive layer 201. Here, there is an overlapping region among the detection conductive layer MD, the adhesive layer 201 and the conductive layer M3. Note that the height of the detection conductive layer MD may be slightly greater than or equal to the height of the micro LED μLED.

A detection capacitor $C_{DET}$ may be formed in the overlapping region among the detection conductive layer MD, the adhesive layer 201, and the conductive layer M3. Besides, the first TFT T1 has a gate GE (corresponding to a control terminal) as well as a source (drain) and a drain (source) respectively formed by p-type heavily doped regions PA1 and PA2. A channel CN is formed between the p-type heavily doped regions PA1 and PA2. Here, the source or drain of the first TFT T1 (corresponding to a first terminal) is coupled to the conductive layer M3 through the conductive via VIA and may be configured to transmit display data DATA.

As provided above, when a stamping process in a mass transfer process is performed to exert a stamping force F to the pixel structure 200, an upper surface of the micro LED μLED and an upper surface of the detection conductive layer MD may together receive approximately the same stamping force F, whereby a distance d1 between the detection conductive layer MD and the conductive layer M3 is changed (e.g., decreased). When the received stamping force F is relatively strong, the distance d1 is relatively short, and the capacitance of the detection capacitor $C_{DET}$ is relatively large according to the operating principle of a parallel-plate capacitor. By contrast, when the received stamping force F is relatively weak, the distance d1 is relatively long, and the capacitance of the detection capacitor $C_{DET}$ is relatively small according to the operating principle of the parallel-plate capacitor. Thereby, the value of the capacitance of the detection capacitor $C_{DET}$ may respond to the strength of the stamping force F. In the embodiment, according to the value of the capacitance of the detection capacitor $C_{DET}$, the value of the driving electric signal of the micro LED μLED may be adjusted, so as to improve the uniformity of the luminance of the micro LED μLED.

Figure 3A:
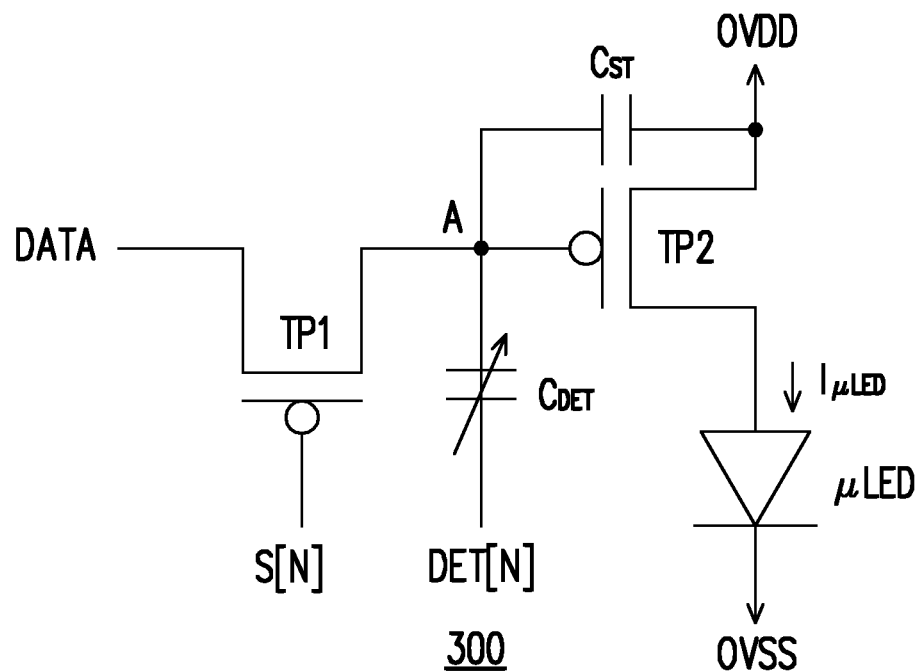
FIG. 3A is a schematic view of a circuitry of the pixel structure depicted in FIG. 2.

The schematic view of an equivalent circuit of the pixel structure 200 is elaborated hereinafter. Please refer to FIG. 2 and FIG. 3A. FIG. 3A is a schematic view of a circuitry of the pixel structure depicted in FIG. 2. In the present embodiment, the pixel structure 300 includes a first TFT TP1, a second TFT TP2, the micro LED μLED, the detection capacitor $C_{DET}$, and a storage capacitor $C_{ST}$. The first TFT TP1 has a second terminal receiving the display data DATA, a control terminal receiving a scan signal S[N], and a first terminal coupled to the conductive layer (e.g., the conductive layer M3 depicted in FIG. 2), and the first TFT TP1 may be configured to transmit the display data DATA to the conductive layer. The second TFT TP2 has a control terminal coupled to the conductive layer, a first terminal receiving a reference voltage OVDD, and a second terminal coupled to the micro LED μLED. The reference voltage OVDD is a first power voltage, and first power voltage is a power voltage, for instance. A second terminal of the detection capacitor $C_{DET}$ receives a detection signal DET[N], and the first terminal of the detection capacitor $C_{DET}$ is coupled to the first terminal of the first TFT TP1. One terminal of the storage capacitor $C_{ST}$ is coupled to the first terminal of the second TFT TP2, and the other terminal of the storage capacitor $C_{ST}$ is coupled to the control terminal of the second TFT TP2. An anode terminal of the micro LED μLED is coupled to the second terminal of the second TFT TP2, and a cathode terminal of the micro LED μLED receives a reference voltage OVSS, wherein the reference voltage OVSS is a second power voltage, and the second power voltage is a ground voltage, for instance.

Figure 3B:
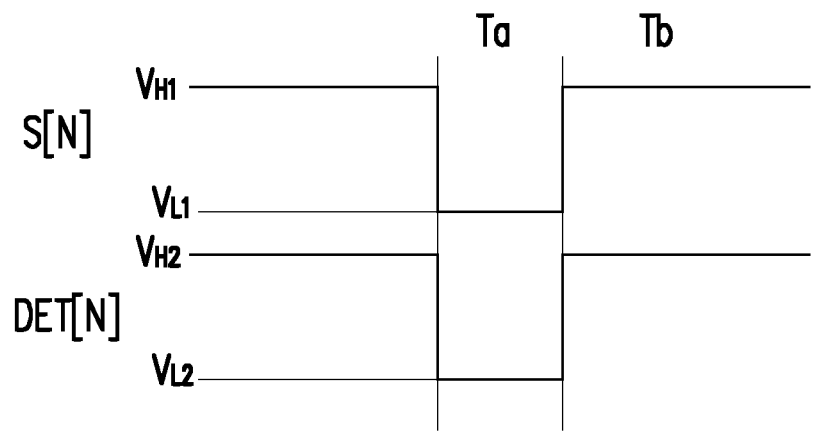
FIG. 3B is a waveform of the driving signal depicted in FIG. 3A.

Detailed circuit operations are explained hereinafter. Please refer to FIG. 3A and FIG. 3B. FIG. 3B is a waveform of the driving signal depicted in FIG. 3A. In a first time period Ta, the first TFT TP1 in the pixel structure 300 is switched on according to the scan signal S[N] at a low voltage level $V_{L1}$ (the first voltage level) and transmits the display data DATA to the control terminal of the second TFT TP2. At the same time, the second terminal of the detection capacitor $C_{DET}$ receives the detection signal DET[N] at a low voltage level $V_{L2}$ (the second voltage level); here, the voltage of a node signal A is substantially the same as the voltage of the display data DATA. In a second time period Tb after the first time period Ta, the first TFT TP1 is switched off according to the scan signal S[N] whose transient state is a high voltage level $V_{H1}$ (the third voltage level). The second terminal of the detection capacitor $C_{DET}$ receives the detection signal DET[N] whose transient state is a high voltage level $V_{H2}$ (the fourth voltage level). Here, the time point at which the detection signal DET[N] has the transient state from the low voltage level $V_{L2}$ to the high voltage level $V_{H2}$ may be the same as or slightly later than the time point at which the scan signal S[N] has the transient state from the low voltage level $V_{L1}$ to the high voltage level $V_{H1}$, which should not be construed as a limitation in the disclosure. At this time, the voltage of the node signal A may be expressed as a mathematical formula (1):

$$\text{DATA} + (V_{H2} - V_{L2})\frac{C_{DET}}{C_{ST} + C_{DET}} \quad (1)$$

The second TFT TP2 may generate a driving current $I_{\mu LED}$ according to the voltage of the node signal A and drive the micro LED μLED through the driving current $I_{\mu LED}$, so that the micro LED μLED emits light.

In the present embodiment, the TFT generates the driving current $I_{\mu LED}$ to drive the micro LED μLED, and the driving current $I_{\mu LED}$ may be expressed as a mathematical formula (2) below. Here, k is a channel constant, and, $V_{TH\_TP2}$ is a threshold voltage of the second TFT TP2. Detailed explanation will be provided hereinafter:

$$I_{\mu LED} = \frac{1}{2}k\left[OVDD - \text{DATA} - (V_{H2} - V_{L2})\frac{C_{DET}}{C_{ST} + C_{DET}} - |V_{TH\_TP2}|\right]^2 \quad (2)$$

Figure 1:
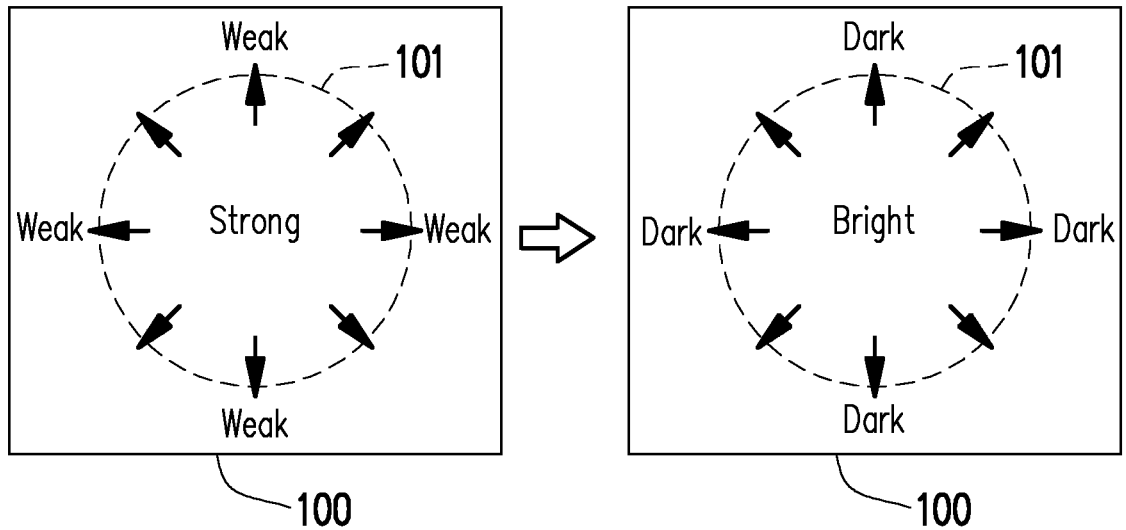
FIG. 1 is a schematic view of a conventional micro LED display panel.

From the mathematical formula (2), it can be learned that the capacitance of the driving current $I_{\mu LED}$ and the capacitance of the detection capacitor $C_{DET}$ are negatively correlated; that is, the greater the capacitance of the detection capacitor $C_{DET}$, the less the driving current $I_{\mu LED}$ generated by the second TFT TP2. On the contrary, the less the capacitance of the detection capacitor $C_{DET}$, the greater the driving current $I_{\mu LED}$ generated by the second TFT TP2. To be specific, with reference to FIG. 1, FIG. 2, FIG. 3A, and the mathematical formula (2), it can be known that when the stamping process is performed, and the stress cannot be evenly distributed, the capacitance of the detection capacitor $C_{DET}$ in regions receiving a relatively large stamping force may be relatively large, and the voltage difference between the source and the gate of the second TFT is reduced to a greater extent, so that the driving current $I_{\mu LED}$ driving the micro LED μLED is reduced to a greater extent, and that the luminance of the micro LED μLED is reduced to a greater extent. The capacitance of the detection capacitor $C_{DET}$ in regions receiving a relatively small stamping force may be relatively small, and the voltage difference between the source and the gate of the second TFT is reduced to a less extent, so that the driving current $I_{\mu LED}$ driving the micro LED μLED is reduced to a less extent, and that the luminance of the micro LED μLED is reduced to a less extent. As such, the uniformity of the overall luminance of the micro LED μLED may be enhanced, and the issue of uneven luminance caused by the uneven distribution of the stamping force may be solved.

Figure 4A:
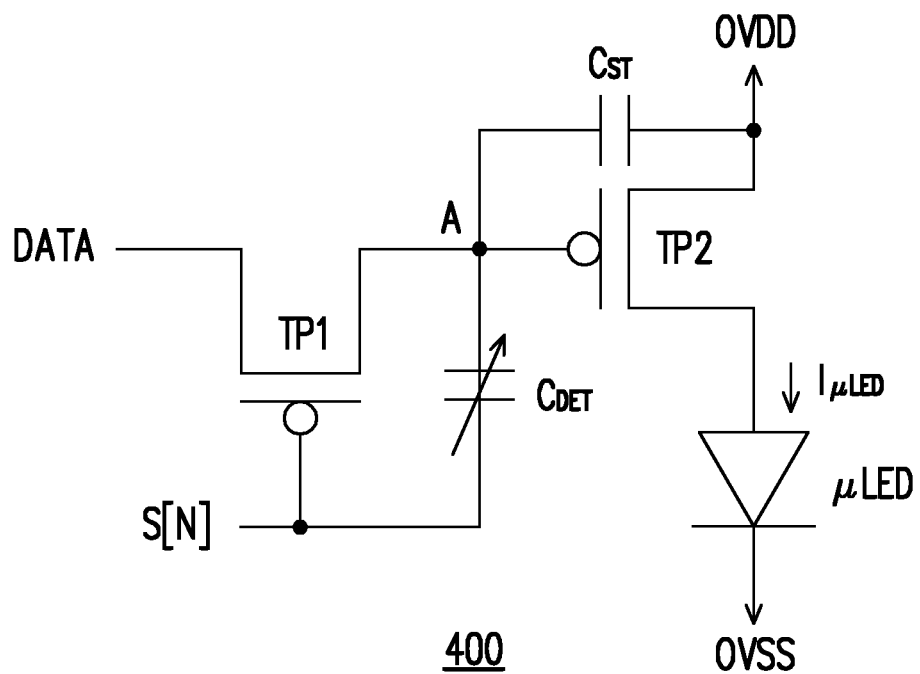
FIG. 4A is a schematic view of a circuitry of the pixel structure depicted in FIG. 3A according to another embodiment of the disclosure.
Figure 4B:
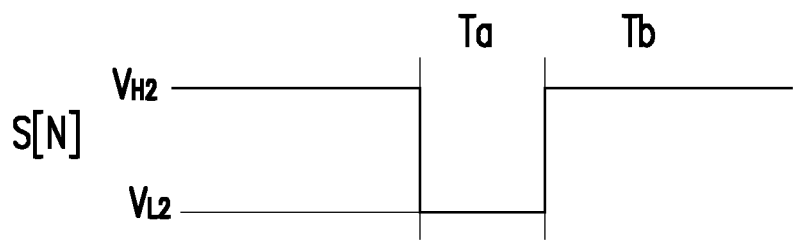
FIG. 4B is a waveform of the driving signal depicted in FIG. 4A.

Please refer to FIG. 4A and FIG. 4B. FIG. 4A is a schematic view of a circuitry of the pixel structure depicted in FIG. 3A according to another embodiment of the disclosure. FIG. 4B is a waveform of the driving signal depicted in FIG. 4A. The difference between the embodiment depicted in FIG. 3A and the present embodiment lies in that the first voltage level is designed to be the same as the second voltage level in the present embodiment, and the third voltage level is designed to be the same as the fourth voltage level in the present embodiment. Besides, in the present embodiment, the scan signal S[N] and the detection signal DET[N] may be combined as one signal. Hence, in the pixel structure 400 provided in the present embodiment, the control terminal of the first TFT TP1 and the detection capacitor $C_{DET}$ together receive the scan signal S[N], so as to complete the driving operation of the pixel structure.

The manner in which the pixel structure 400 operates is similar to the manner in which the pixel structure 300 operates and therefore will not be further explained.

Figure 5A:
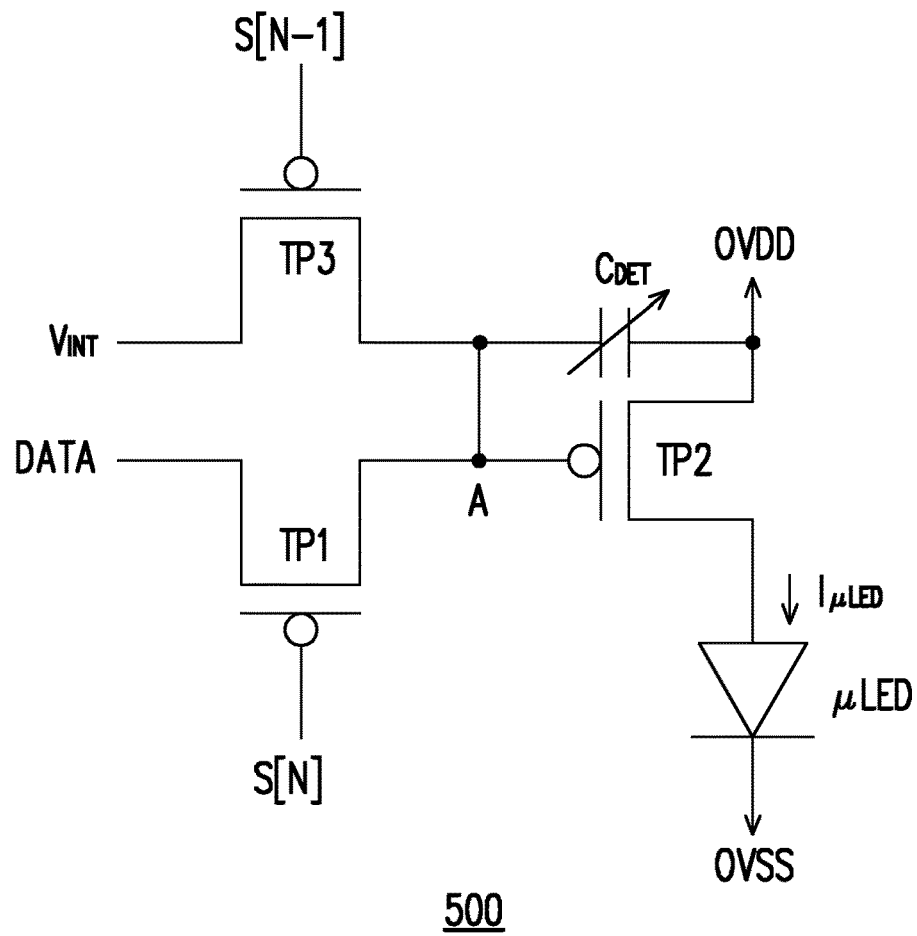
FIG. 5A is a schematic view of a circuitry of a pixel structure according to another embodiment of the disclosure.
Figure 5B:
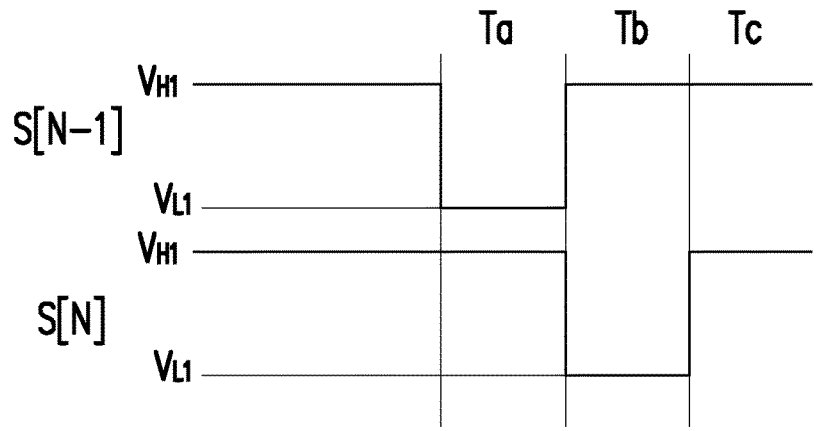
FIG. 5B is a waveform of the driving signal depicted in FIG. 5A.

FIG. 5A is a schematic view of a circuitry of a pixel structure according to another embodiment of the disclosure. FIG. 5B is a waveform of the driving signal depicted in FIG. 5A. The pixel structure 500 includes the first TFT TP1, the second TFT TP2, a third TFT TP3, the micro LED μLED, and the detection capacitor $C_{DET}$. The first TFT TP1 has the second terminal receiving the display data DATA, the control terminal receiving the scan signal S[N], and the first terminal coupled to the conductive layer (e.g., the conductive layer M3 depicted in FIG. 2), and the first TFT TP1 may be configured to transmit the display data DATA to the conductive layer. The second TFT TP2 has the control terminal coupled to the conductive layer, the first terminal receiving the reference voltage OVDD, and the second terminal coupled to the micro LED μLED. One terminal of the third TFT TP3 receives an initial voltage $V_{INT}$, and the other terminal of the third TFT TP3 is coupled to the control terminal of the second TFT TP2. The third TFT TP3 is controlled by a pre-scan signal S[N−1] and is thus switched on or off. Here, the initial voltage $V_{INT}$ may be at a high voltage level. The detection capacitor $C_{DET}$ is coupled between the first terminal and the control terminal of the second TFT TP2 and is coupled to the third TFT TP3. The anode terminal of the micro LED μLED is coupled to the second terminal of the second TFT TP2, and the cathode terminal of the micro LED μLED receives the reference voltage OVSS.

As to the detailed operations of the circuit, in the first time period Ta, the third TFT TP3 in the pixel structure 500 may be switched on according to the pre-scan signal S[N−1] at the low voltage level $V_{L1}$ and thereby transmit the initial voltage $V_{INT}$ to the control terminal of the second TFT TP2 in the first time period Ta. At this time, the voltage of the node signal A may be substantially the same as the initial voltage $V_{INT}$. In the second time period Tb after the first time period Ta, the third TFT TP3 is switched off according to the pre-scan signal S[N−1] at the high voltage level $V_{H1}$, and the first TFT TP1 is switched on according to the scan signal S[N] at the low voltage level $V_{L1}$. The first TFT TP1 transmits the display data DATA to the control terminal of the second TFT TP2, and at this time the voltage $V_A(t)$ of the node signal A may be expressed as a mathematical formula (3):

$$V_A(t)=DATA+(V_{INT}-DATA)e^{-t/\tau} \quad (3)$$

Here, τ is a time constant of the capacitor and the resistor and is correlated to an on-resistance of the first TFT TP1 and the detection capacitor $C_{DET}$, and t is time.

In a third time period Tc after the second time period Tb, the first TFT TP1 is switched off according to the scan signal S[N] whose transient state is the high voltage level $V_{H1}$, and the second TFT TP2 generates the driving current $I_{μLED}$ according to the voltage of the node signal A and drives the micro LED μLED through the driving current $I_{μLED}$.

Figure 6A:
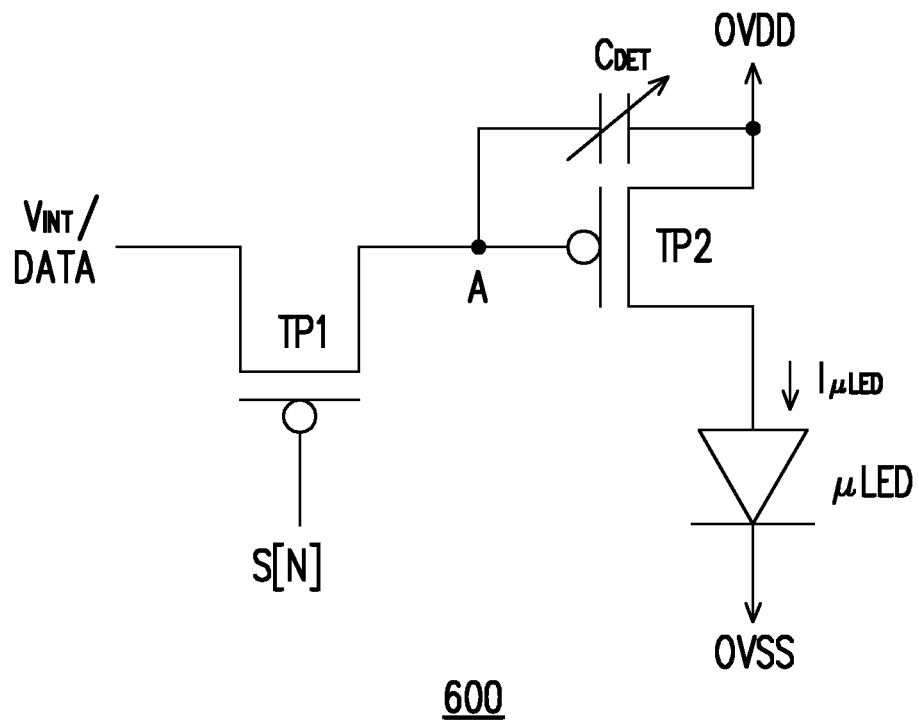
FIG. 6A is a schematic view of a circuitry of the pixel structure depicted in FIG. 5A according to another embodiment of the disclosure.
Figure 6B:
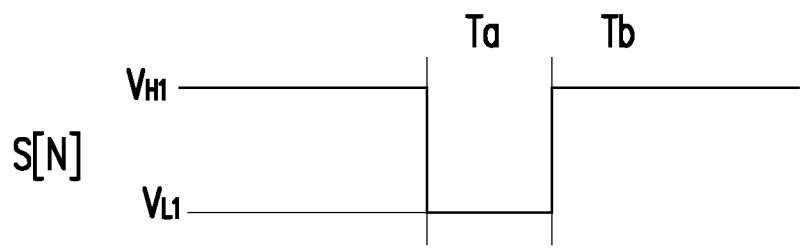
FIG. 6B is a waveform of the driving signal depicted in FIG. 6A.

Please refer to FIG. 6A and FIG. 6B. FIG. 6A is a schematic view of a circuitry of the pixel structure depicted in FIG. 5A according to another embodiment of the disclosure. FIG. 6B is a waveform of the driving signal of the pixel structure depicted in FIG. 6A. The difference between the embodiment shown in FIG. 5A and the present embodiment lies in that the initial voltage $V_{INT}$ and the display data DATA are sequentially transmitted to the first TFT TP1 in the present embodiment.

The manner in which the pixel structure 600 operates is similar to the manner in which the pixel structure 500 operates and therefore will not be further explained.

Figure 7A:
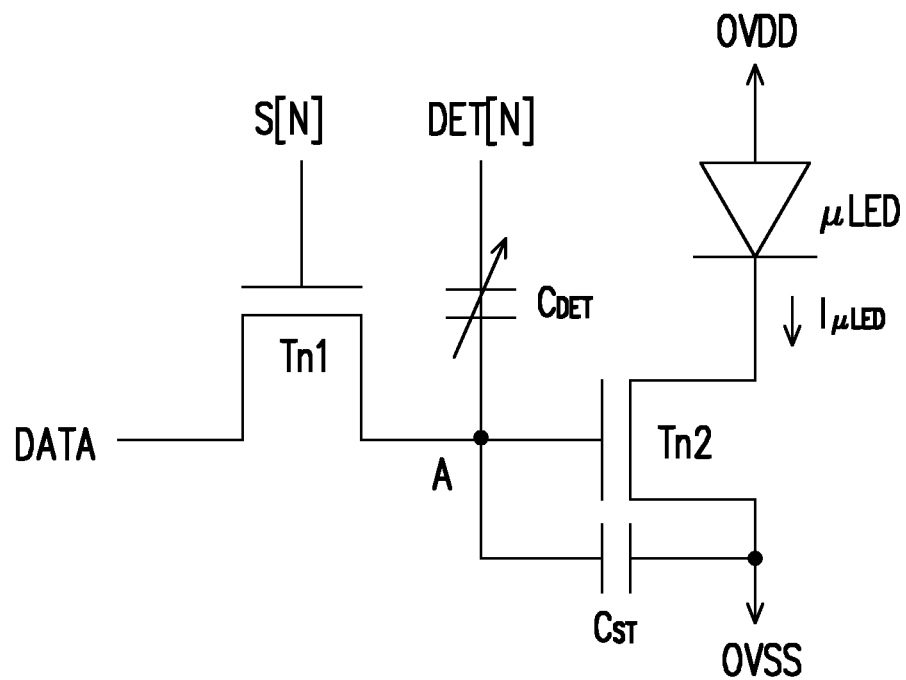
FIG. 7A is a schematic view of a circuitry of the pixel structure depicted in FIG. 3A according to a complementary embodiment of the disclosure.

FIG. 7A is a schematic view of a circuitry of the pixel structure depicted in FIG. 3A according to a complementary embodiment of the disclosure. The difference between the embodiment shown in FIG. 3A and the present embodiment lies in that the transistor of the present embodiment is complementary to the corresponding transistor in the pixel structure 300, e.g., an n-type TFT.

As provided above, in the present embodiment, the pixel structure 700 includes a first TFT Tn1, a second TFT Tn2, the micro LED μLED, the detection capacitor $C_{DET}$, and the storage capacitor $C_{ST}$. The first TFT Tn1 has a second terminal receiving the display data DATA, a control terminal receiving the scan signal S[N], and a first terminal coupled to the conductive layer (e.g., the conductive layer M3 depicted in FIG. 2), and the first TFT Tn1 may be configured to transmit the display data DATA to the conductive layer. The second TFT Tn2 has a control terminal coupled to the conductive layer, a first terminal receiving the reference voltage OVSS, and a second terminal coupled to the micro LED μLED. The second terminal of the detection capacitor $C_{DET}$ receives the detection signal DET[N], and the first terminal of the detection capacitor $C_{DET}$ is coupled to the first terminal of the first TFT Tn1. One terminal of the storage capacitor $C_{ST}$ is coupled to the first terminal of the second TFT Tn2, and the other terminal of the storage capacitor $C_{ST}$ is coupled to the control terminal of the second TFT Tn2. One terminal of the micro LED μLED is coupled to the second terminal of the second TFT Tn2, and the other terminal of the micro LED μLED receives the reference voltage OVDD.

Figure 7B:
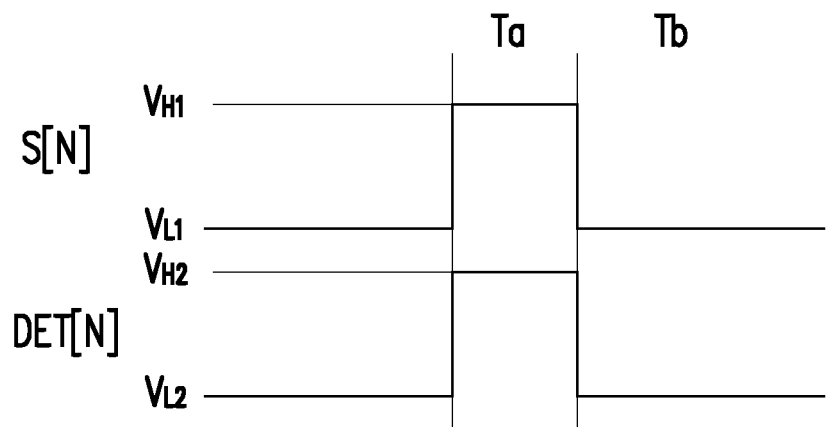
FIG. 7B is a waveform of the driving signal depicted in FIG. 7A.

Detailed circuit operations are explained hereinafter. Please refer to FIG. 7A and FIG. 7B. FIG. 7B is a waveform of the driving signal depicted in FIG. 7A. In the first time period Ta, the first TFT Tn1 in the pixel structure 700 is switched on according to the scan signal S[N] at the high voltage level $V_{H1}$ (the first voltage level) and transmits the display data DATA to the control terminal of the second TFT Tn2. At the same time, the second terminal of the detection capacitor CDET receives the detection signal DET[N] at the high voltage level $V_{H2}$ (the second voltage level); here, the voltage of the node signal A is substantially the same as the voltage of the display data DATA. In a second time period Tb after the first time period Ta, the first TFT Tn1 is switched off according to the scan signal S[N] whose transient state is the low voltage level $V_{L1}$ (the third voltage level). The second terminal of the detection capacitor CDET receives the detection signal DET[N] whose transient state is the low voltage level $V_{L2}$ (the fourth voltage level). Here, the time point at which the detection signal DET[N] has the transient state at the low voltage level $V_{L2}$ may be the same as or slightly later than the time point at which the scan signal S[N] has the transient state at the low voltage level $V_{L1}$, which should not be construed as a limitation in the disclosure. At this time, the voltage of the node signal A may be expressed as a mathematical formula (4):

$$DATA + (V_{L2} - V_{H2}) \frac{C_{DET}}{C_{ST} + C_{DET}} \quad (4)$$

The second TFT Tn2 may generate the driving current IμLED according to the voltage of the node signal A and drives the micro LED μLED through the driving current IμLED.

Figure 8A:
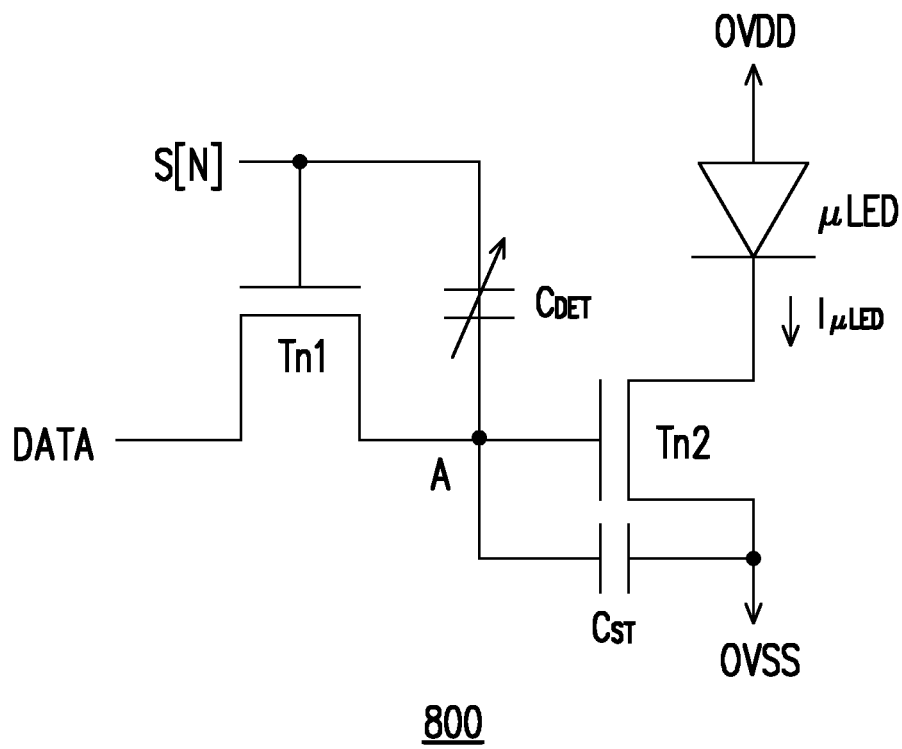
FIG. 8A is a schematic view of a circuitry of the pixel structure depicted in FIG. 7A according to another embodiment of the disclosure.
Figure 8B:
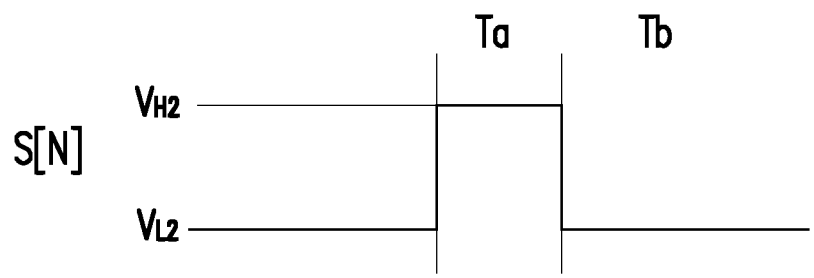
FIG. 8B is a waveform of the driving signal depicted in FIG. 8A.

Please refer to FIG. 8A and FIG. 8B. FIG. 8A is a schematic view of a circuitry of the pixel structure depicted in FIG. 7A according to another embodiment of the disclosure. FIG. 8B is a waveform of the driving signal depicted in FIG. 8A. The difference between the embodiment depicted in FIG. 8A and the present embodiment lies in that the first voltage level is designed to be the same as the second voltage level in the present embodiment, and the third voltage level is designed to be the same as the fourth voltage level in the present embodiment. Besides, in the present embodiment, the scan signal S[N] and the detection signal DET[N] may be combined as one signal. Hence, in the pixel structure 800 provided in the present embodiment, the control terminal of the first TFT Tn1 and the detection capacitor $C_{DET}$ together receive the scan signal S[N], so as to complete the driving operation of the pixel structure.

The manner in which the pixel structure 800 operates is similar to the manner in which the pixel structure 700 operates and therefore will not be further explained.

Figure 9A:
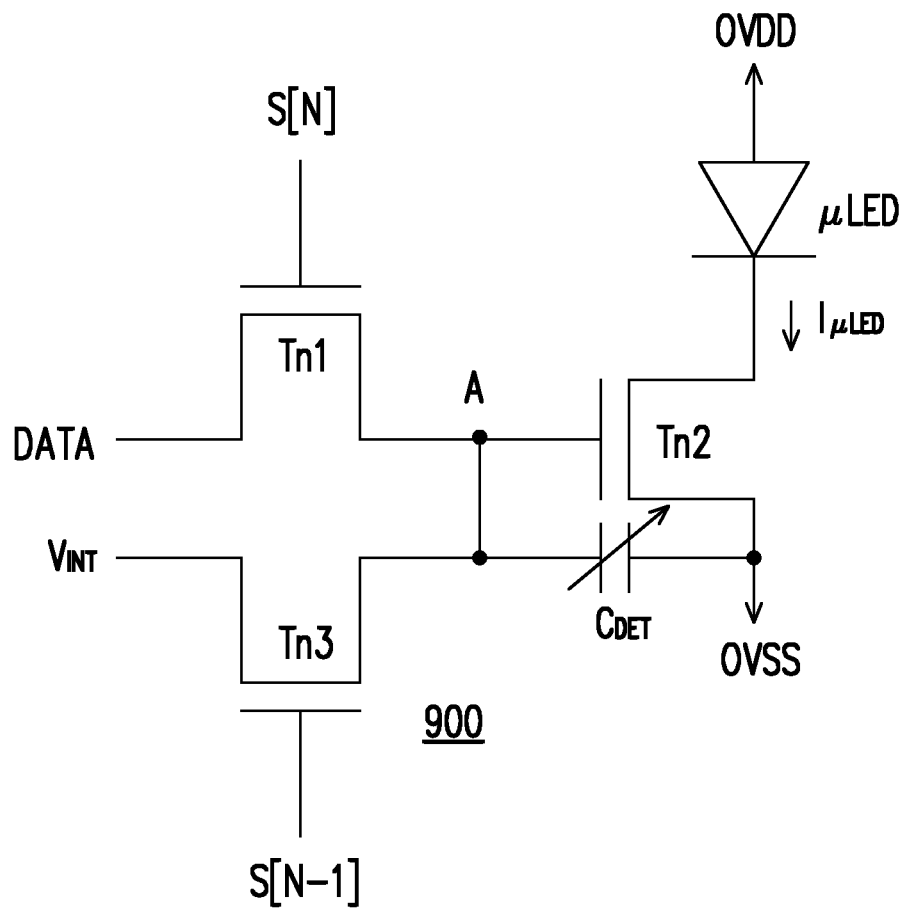
FIG. 9A is a schematic view of a circuitry of the pixel structure depicted in FIG. 5A according to a complementary embodiment of the disclosure.
Figure 9B:
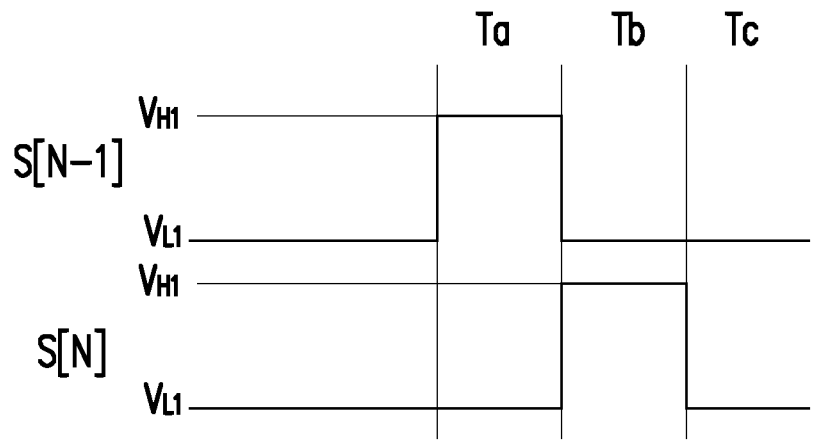
FIG. 9B is a waveform of the driving signal depicted in FIG. 9A.

Please refer to FIG. 9A and FIG. 9B. FIG. 9A is a schematic view of a circuitry of the pixel structure depicted in FIG. 5A according to a complementary embodiment of the disclosure. FIG. 9B is a waveform of the driving signal depicted in FIG. 9A. The difference between the embodiment shown in FIG. 5A and the present embodiment lies in that the transistor of the present embodiment is complementary to the corresponding transistor in the pixel structure 500, e.g., an n-type TFT.

As provided above, the pixel structure 900 includes the first TFT Tn1, the second TFT Tn2, a third TFT Tn3, the micro LED μLED, and the detection capacitor $C_{DET}$. The first TFT Tn1 has the second terminal receiving the display data DATA, the control terminal receiving the scan signal S[N], and the first terminal coupled to the conductive layer, and the first TFT Tn1 may be configured to transmit the display data DATA to the conductive layer. The second TFT Tn2 has the control terminal coupled to the conductive layer, the first terminal receiving the reference voltage OVSS, and the second terminal coupled to the micro LED μLED. One terminal of the third TFT Tn3 receives the initial voltage $V_{INT}$, and the other terminal of the third TFT Tn3 is coupled to the control terminal of the second TFT Tn2, and the third TFT Tn3 is controlled by a pre-scan signal S[N−1] and is thus switched on or off. Here, the initial voltage $V_{INT}$ may be at a low voltage level. The detection capacitor $C_{DET}$ is coupled to between the first terminal and the control terminal of the second TFT Tn2 and is coupled to the third TFT Tn3. The cathode terminal of the micro LED μLED is coupled to the second terminal of the second TFT Tn2, and the anode terminal of the micro LED μLED receives the reference voltage OVDD.

As to the detailed operations of the circuit, in the first time period Ta, the third TFT Tn3 in the pixel structure 900 may be switched on according to the pre-scan signal S[N−1] at the high voltage level $V_{H1}$ and thereby transmit the initial voltage $V_{INT}$ to the control terminal of the second TFT TP2 in the first time period Ta. At this time, the voltage of the node signal A may be substantially the same as the initial voltage $V_{INT}$. In the second time period Tb after the first time period Ta, the third TFT Tn3 is switched off according to the pre-scan signal S[N−1] at the low voltage level $V_{L1}$, and the first TFT Tn1 is switched on according to the scan signal S[N] at the high voltage level $V_{H1}$. The first TFT Tn1 transmits the display data DATA to the control terminal of the second TFT Tn2, and at this time the voltage $V_A(t)$ of the node signal A may be expressed as a mathematical formula (5):

$$V_A(t)=V_{INT}+(DATA-V_{INT})(1-e^{t/\tau}) \quad (5)$$

In a third time period Tc after the second time period Tb, the first TFT Tn1 is switched off according to the scan signal S[N] whose transient state is the low voltage level $V_{L1}$, and the second TFT Tn2 generates the driving current $I_{\mu LED}$ according to the voltage of the node signal A and drives the micro LED μLED through the driving current $I_{\mu LED}$.

Figure 10A:
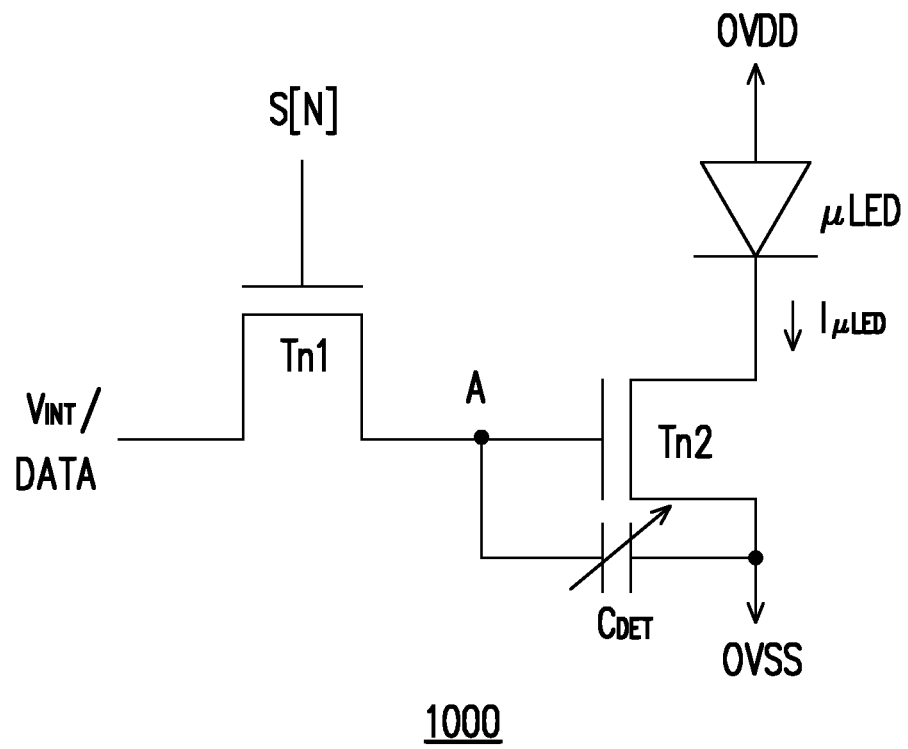
FIG. 10A is a schematic view of a circuitry of the pixel structure depicted in FIG. 9A according to another embodiment of the disclosure.
Figure 10B:
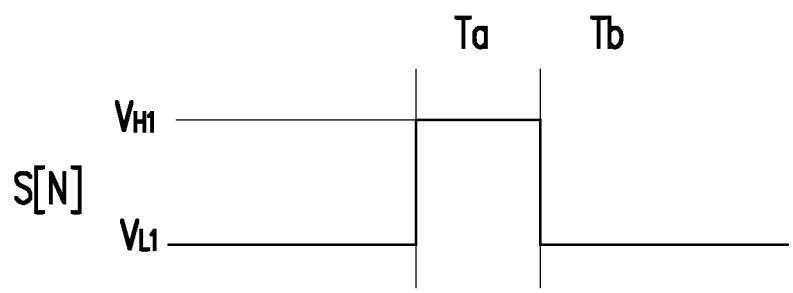
FIG. 10B is a waveform of the driving signal depicted in FIG. 10A.

Please refer to FIG. 10A and FIG. 10B. FIG. 10A is a schematic view of a circuitry of the pixel structure depicted in FIG. 9A according to another embodiment of the disclosure. FIG. 10B is a waveform of the driving signal depicted in FIG. 10A. The difference between the embodiment depicted in FIG. 9A and the present embodiment lies in that the initial voltage $V_{INT}$ and the display data DATA may be combined as one set of signals capable of transmitting the initial voltage $V_{INT}$ and the display data DATA. Hence, in the present embodiment, the first TFT Tn1 in the pixel structure 1000 is operated with one set of scan signals S[N], and the control of the control terminal of the third TFT Tn3 is omitted, so as to complete the driving operation of the pixel structure.

The manner in which the pixel structure 1000 operates is similar to the manner in which the pixel structure 900 operates and therefore will not be further explained.

In view of the above, the detection conductive layer whose height is not lower than that of the LED is configured to receive a pressure exerted during the stamping process, and the value of the capacitance of the detection capacitor constituted by the detection conductive layer, the adhesive layer, and the conductive layer is adjusted according to the pressure received by the detection conductive layer. Additionally, the relative value of the capacitance of the detection capacitor may respond to the strength of the stamping force, and the value of the driving electric signal of the micro LED is adjusted according to the correlation between the capacitance of the capacitor and the stamping force, so as to better bring the overall luminance of the micro LED into uniformity, solve the issue of uneven luminance caused by the uneven distribution of the stamping force, and improve display quality.

It will be apparent to those skilled in the art that various modifications and variations can be made to the structure provided herein without departing from the scope or spirit of the disclosure. In view of the foregoing, it is intended that the disclosure provide modifications and variations provided they fall within the scope of the following claims and their equivalents.

What is claimed is:

1. A pixel structure comprising:
   a first thin film transistor having a first terminal coupled to a conductive layer and configured to transmit display data to the conductive layer;
   an adhesive layer disposed on the conductive layer;
   a light emitting diode disposed on the adhesive layer; and
   a detection conductive layer disposed on the adhesive layer, wherein the detection conductive layer, the adhesive layer, and the conductive layer constitute a detection capacitor,
   wherein a thickness of the detection conductive layer is equal to or slightly greater than a height of the light emitting diode.

2. The pixel structure according to claim 1, wherein when a stamping process is performed on the pixel structure, an upper surface of the light emitting diode and an upper surface of the detection conductive layer together receive a same stamping force.

3. The pixel structure according to claim 1, further comprising:
   a second thin film transistor, wherein a control terminal of the second thin film transistor is coupled to the conductive layer, a first terminal of the second thin film transistor receives a reference voltage, and a second terminal of the second thin film transistor is coupled to the light emitting diode.

4. The pixel structure according to claim 3, wherein a control terminal of the first thin film transistor receives a scan signal, and the detection conductive layer receives a detection signal,
   wherein in a first time period the first thin film transistor is turned on according to the scan signal and transmits the display data to the control terminal of the second thin film transistor, and the detection conductive layer simultaneously receives the detection signal at a first voltage level,
   and in a second time period after the first time period, the first thin film transistor is turned off according to the scan signal, the detection conductive layer simultaneously receives the detection signal at a second voltage level, wherein the first voltage level is different from the second voltage level.

5. The pixel structure according to claim 4, wherein the scan signal and the detection signal are identical signal.

6. The pixel structure according to claim 4, wherein when the first thin film transistor and the second thin film transistor are both p-type thin film transistors, the first voltage level is lower than the second voltage level, and the reference voltage is a first power voltage.

7. The pixel structure according to claim 4, wherein when the first thin film transistor and the second thin film transistor are both n-type thin film transistors, the first voltage level is higher than the second voltage level, and the reference voltage is a second power voltage.

8. The pixel structure according to claim 3, wherein the detection conductive layer is coupled to the first terminal of the second thin film transistor.

9. The pixel structure according to claim 8, wherein the second terminal of the first thin film transistor receives an initial voltage or the display data, wherein when the first thin film transistor is switched on, the first thin film transistor sequentially receives and transmits the initial voltage and the display data to the control terminal of the second thin film transistor.

10. The pixel structure according to claim 8, further comprising:
a third thin film transistor, one terminal of the third thin film transistor receiving an initial voltage, the other terminal of the third thin film transistor being coupled to the control terminal of the second thin film transistor, the third thin film transistor being controlled by a pre-scan signal and being switched on or off.

11. The pixel structure according to claim 3, further comprising:
a storage capacitor coupled between the control terminal and the first terminal of the second thin film transistor.

12. The pixel structure according to claim 3, wherein the second thin film transistor generates a driving current to drive the light emitting diode, and a capacitance of the driving current and a capacitance of the detection capacitor are negatively correlated.

* * * * *